United States Patent
Henry et al.

(10) Patent No.: US 10,125,868 B2
(45) Date of Patent: Nov. 13, 2018

(54) PISTON PIN AND METHOD OF APPLYING AN ANTI-SEIZE COATING ON THE PIN

(71) Applicants: H.E.F., Andrezieux Boutheon (FR); MAHLE INTERNATIONAL GMBH, Stuttgart (DE)

(72) Inventors: Sandrine Henry, Saint-Paul-en-Jarez (FR); Christophe Heau, Saint-Etienne (FR); Fabrice Prost, Saint-Etienne (FR); Roland Lochmann, Marbach (DE); Marco Maurizi, Stuttgart (DE)

(73) Assignees: H.E.F., Andrezieux Boutheon (FR); MAHLE INTERNATIONAL GMBH, Stuttgart (DE)

( * ) Notice: Subject to any disclaimer, the term of this patent is extended or adjusted under 35 U.S.C. 154(b) by 282 days.

(21) Appl. No.: 14/912,496

(22) PCT Filed: Aug. 12, 2014

(86) PCT No.: PCT/EP2014/067274
§ 371 (c)(1),
(2) Date: Feb. 17, 2016

(87) PCT Pub. No.: WO2015/028305
PCT Pub. Date: Mar. 5, 2015

(65) Prior Publication Data
US 2016/0201799 A1 Jul. 14, 2016

(30) Foreign Application Priority Data
Aug. 30, 2013 (DE) .................. 10 2013 014 385
Sep. 27, 2013 (FR) ....................... 13 59324

(51) Int. Cl.
F16J 1/16 (2006.01)
C23C 16/27 (2006.01)
(Continued)

(52) U.S. Cl.
CPC ............... F16J 1/16 (2013.01); C23C 14/00 (2013.01); C23C 14/0605 (2013.01);
(Continued)

(58) Field of Classification Search
CPC ............... F16J 1/16; F16J 1/18; F02F 3/0069
See application file for complete search history.

(56) References Cited

U.S. PATENT DOCUMENTS 1,772,187 A 8/1930 Manning
4,572,058 A 2/1986 Hinz et al.
(Continued)

FOREIGN PATENT DOCUMENTS

DE 35 26 396 C1 10/1986
DE 10 2006 008 910 A1 9/2007
(Continued)

OTHER PUBLICATIONS

International Search Report for International Application No. PCT/EP2014/067274 dated Sep. 8, 2014.

*Primary Examiner* — Michael Leslie
(74) *Attorney, Agent, or Firm* — Heslin Rothenberg Farley & Mesiti P.C.

(57) ABSTRACT

The piston pin has an anti-seize coating limited to an angular sector corresponding at least to a friction area submitted to a contact pressure along a preferential direction.

12 Claims, 8 Drawing Sheets

(51) Int. Cl.
  *C23C 16/50* (2006.01)
  *C23C 14/06* (2006.01)
  *C23C 14/00* (2006.01)
  *C23C 14/02* (2006.01)

(52) U.S. Cl.
  CPC .............. *C23C 16/27* (2013.01); *C23C 16/50* (2013.01); *C23C 14/024* (2013.01)

(56) References Cited

U.S. PATENT DOCUMENTS

| | | |
|---|---|---|
| 6,886,521 B2 | 5/2005 | Hamada et al. |
| 7,228,786 B2 | 6/2007 | Hamada et al. |
| 7,939,172 B2 * | 5/2011 | Gorokhovsky ....... C23C 14/024 428/408 |
| 2008/0156185 A1 | 7/2008 | Perrone |

FOREIGN PATENT DOCUMENTS

| | | |
|---|---|---|
| DE | 10 2010 051682 A1 | 5/2012 |
| FR | 2 975 404 A1 | 11/2012 |
| JP | H09 72418 A | 3/1997 |
| JP | 2000 161486 A | 6/2000 |
| JP | 2005 226784 A | 8/2005 |
| WO | 2009/104030 A2 | 8/2009 |

\* cited by examiner

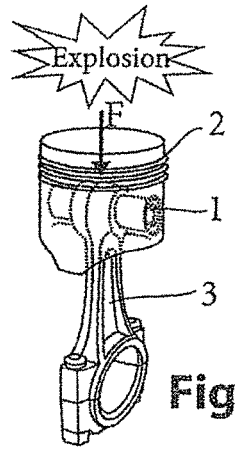
Fig. 5
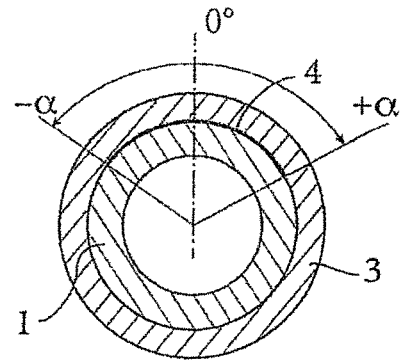
Fig. 6
Fig. 7
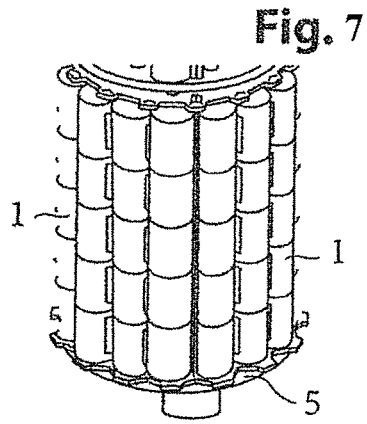
Fig. 8
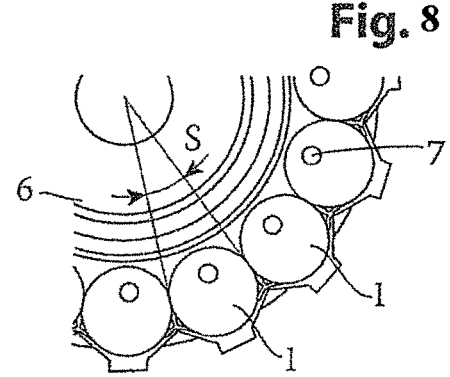
Fig. 9
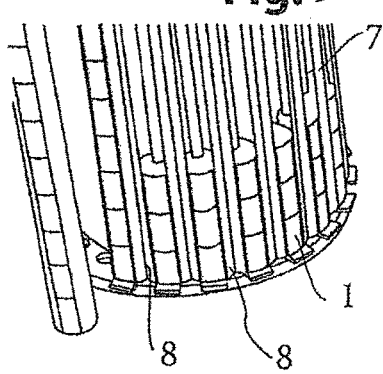
Fig. 10
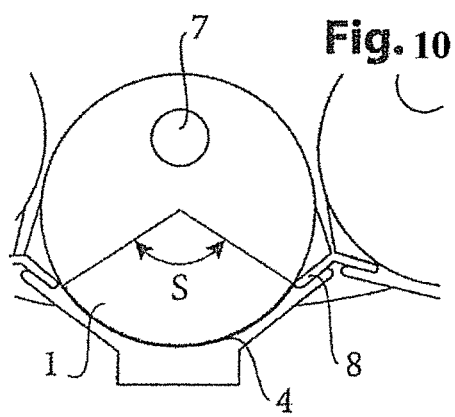

Tight pin application

Ø17 x 10 x 46 mm - Without DLC:  Ø17 x 11 x 44 mm - With DLC:

Average pressure on boss = 58 N/mm²  Average pressure on boss = 63 N/mm²

Pin Upper Side

Pin Lower Side

Upper Side of Pin

Lower Side of Pin

Symmetrical pressing (center web):

Asymmetrical pressing (side web):

For example: X = 0.2 – 0.5 mm

PISTON PIN AND METHOD OF APPLYING AN ANTI-SEIZE COATING ON THE PIN

CROSS REFERENCE TO RELATED APPLICATIONS

This application is a national stage filing under section 371 of International Application No. PCT/EP2014/067274, filed on Aug. 12, 2014, and published in English on Mar. 5, 2015, as WO 2015/028305 A1 and claims priority of German application no. 10 2013 014 385.3 filed on Aug. 30, 2013 and French application no. 1359324 filed on Sep. 27, 2013, the entire disclosure of these applications being hereby incorporated herein by reference.

BACKGROUND ART

The invention relates to the field of tribological contacts, and more generally to any system where a pin is tightly assembled and is submitted to stress along a preferential direction inducing a stress of said pin according to a partial angular sector. The invention advantageously relates to a piston pin.

Two types of piston pin-to-connecting rod connections are currently used:
 a) Floating connection
 b) Tight connection A floating connection enables to assemble the pin so that it can freely rotate in the connecting rod and in the piston. The connecting rod and the piston may in certain cases be bushed by means of a shrunk-on brass piece. The pin is stopped in translation by means of snap rings (circlipses). The snap rings are held in position in grooves machined at the ends of the piston pin opening. The floating assembly enables to substantially decrease the relative speed between the bodies in contact and to thus push back the seizing limit while decreasing contact friction. This assembly thereby has a higher performance. It however requires a precise machining of the connecting rod (or ring) as well as the machining of recesses to block the snap rings. The snap rings also have to be mounted on the assembled piston-pin-connecting rod assembly, which requires using specific means and tools. The piston compression height is constrained by such an assembly and does not enable to optimize the piston mass. It is thus preferentially used in high-load applications (diesel or turbo gasoline engines). Coated pins (with a DLC coating, for example) enable to push back seizing limits while decreasing the friction (see FIG. 11). According to the application, the CO2 gain may reach from 0.2 to 0.5% on a NEDC cycle (according to the application).

A tight connection does not require using snap rings. The pin is tightly assembled in the connecting rod by a connecting rod heating process. Rapid heating means (induction) are generally used on assembly lines. The pin thus tightened follows the pendular motion of the connecting rod which imposes thereto an alternating rotating motion in the piston pin holes. Such a relative motion makes the assembly more sensitive to pin seizing phenomena in the piston. It is thus necessary to provide a good lubrication thereof (for example, by means of recesses and/or grooves) and the use of a coating (DLC, for example) enables to increase the resistance to seizing while decreasing friction. The connecting rod machining is extremely simplified and the absence of a bushing enables to decrease the cross-section of the small end of the connecting rod to minimize the bulk thereof, in terms of outer diameter as well as of width. This technology enables to optimize the piston compression height and provides a mass gain for certain applications. It substantially contributes to decreasing the height of engines. On small vehicles, this solution enables to decrease the height under the hood and to thus limit the aerodynamic coefficient, and accordingly aerodynamic losses. Such a technology is reserved to low-load applications, which however represents most of urban or medium-range vehicles. The mass gain may also enable to limit hammer effects and enable to suppress balance shafts, particularly on 2 or 3-cylinder applications. The potential gains thus have to be expressed in the context of the applications.

The applicants reckon that from 30% to 40% of engines produced to date use a tight connection. The use of a DLC coating for tight pins provides a significant gain on friction, mass, and seizing resistance. FIG. 12 is a perfect illustration thereof. For a same application, the use of DLC enables to decrease the pin mass by 20% and to increase the specific pressure by 10%.

Piston pins provided with an antifriction coating are known, for example, from patents DE 10 2006 008 910 A1, U.S. Pat. No. 6,886,521 B2, and U.S. Pat. No. 7,228,786 B2. Some constructors already use this serial manufacturing technology. However, the application of such friction-decreasing coatings is not economically possible if the deposition rate is low due to the deposition method. In the case of tight pins, it is difficult to generalize this solution, due to its cost but also due to the programmed wearing of the coating used.

The applicants have studied these applications and have observed an atypical behavior of tight coated pins with respect to floating coated pins. In the case of a tight pin, the wearing is concentrated on the upper area of the pin, while the lower area is simply polished. After endurance tests, it can be observed that the DLC coating may have totally disappeared from the upper contact area while the coating thickness remains almost intact. FIG. 12 shows the results obtained after an endurance test equivalent to 300,000 km on a vehicle. These results perfectly illustrate this phenomenon. An explanation of the phenomenon can be provided by studying the forces exerted on the pin (see FIGS. 14 and 15).

Based on this observation, the applicants have devised a solution to create a pin having different properties according to its orientation.

The desired aim according to the invention is to:
 1°) Decrease the friction in the pin/housing contact by using a DLC coating on the pin.
 2°) Adapt the type of DLC coating to the tight pin application in order to increase the resistance to wear without damaging the antagonist.
 3°) Create a variable distribution of the coating corresponding to the preferential load area of tight pin applications.
 4°) Decrease the treatment time for the DLC coating.
 5°) Increase the loading capacity of coating enclosures.
 6°) Simplify the pin positioning means used for the coating of the pins used up to now, by for example suppressing the rotation.
 7°) Increase the loading capacity of coating machines.
 8°) Increase the pin resistance by means of an asymmetrical shape corresponding to the polar diagram of the applied forces.
 9°) Enable to assemble the tight pins with existing assembly means. The pins just have to be properly oriented on assembly.

The present invention aims at providing a generic structural unit where the coated piston pin can be formed by using a rather simple technology.

More generally, the problem that the invention aims at solving is, in the case of a tightly-assembled pin stressed according to a preferential direction, thus inducing a stress on the pin according to a partial angular sector, which particularly concerns piston pins, to enable the engine operator to increase the load of the rotating assembly, to suppress any risk of seizing by using a DLC-type coating, particularly in special conditions, to significantly decrease implementation costs.

BRIEF SUMMARY OF THE INVENTION

To solve such a problem, the piston pin has a DLC-type anti-seize coating limited to an angular sector corresponding at least to a friction area submitted to a contact pressure along a preferential direction, outside of said friction area, the pin has or not a coated area having thickness and/or hardness and/or friction coefficient characteristics lower than the characteristics of the anti-seize coating of the considered angular sector.

Due to these characteristics, the anti-seize coating is applied only on the stressed angular sector to decrease the surface area to be treated and accordingly decrease implementation costs.

The fact of partially coating the pin is not obvious to those skilled in the art who, on the contrary, are dissuaded from using such a technique, which requires a precise angular positioning of the pin on assembly thereof so that the friction area corresponds to the coated area.

It can also be observed that the fact of partially coating the pin enables to envisage the use of an anti-seize coating having a greater thickness that in prior art, thus increasing the pin lifetime.

According to other features, the anti-seize coating is DLC. The coated angular sector is in the range from 15° (from −7.5° to +7.5°) to 240° (from −120° to +120°) and preferably from 15° (from −7.5° to +7.5°) to 220° (from −110° to +110°). The coating thickness is uniform to within ±20% on the friction area. The coating thickness is in the range from 1 to 10 µm.

The invention also relates to a solution according to which a piston pin is fixedly arranged in the small end of the connecting rod and a coating which extends on the peripheral area which is submitted to the highest load during the engine operation at least in the area of the piston boss bores.

The invention provides applying an antifriction coating only in the areas of the piston pin which are submitted to the highest load during the engine operation, at least outside of the area of the piston pin covered with the connecting rod. The invention further provides using a so-called tight connecting rod, that is, a connecting rod having the piston pin fixedly and immovably assembled in its small end. This means that, during the engine operation, the piston pin has a commonly known pendular motion in boss bores so that only a well defined peripheral area of the piston pin is exposed to a high stress.

To solve the problem of applying the DLC-type anti-seize coating on a portion only of the pin, the invention also relates to a method for applying this coating.

According to an embodiment:
the pins are circularly positioned on a support, along at least one row and in tangency position,
the pin rotation relative to the support is locked,
the support fitted with the pins is placed in a vacuum enclosure,
the support fitted with the pins is rotated,
the anti-seize coating is selectively deposited on the pins over an angular sector delimited by the tangency positioning of said pins.

In another embodiment:
the pins are circularly positioned on a support, along at least one row and in tangency or quasi-tangency position,
a protection element capable of delimiting, for each of the pins, an angular sector, is arranged between each pin,
the pin rotation relative to the support is locked,
the support fitted with the pins is arranged in a vacuum enclosure,
the support fitted with the pins is rotated,
the anti-seize coating is selectively deposited over the angular sector delimited by the added protection element.

Angularly orienting and indexing the pin appears to be essential to obtain good results. A plurality of solutions can be envisaged. The most commonly-used method comprises extruding a slug of material to give it the raw shape of the pin. The final shape is given by turning and rectification operations.

The extrusion may be performed symmetrically or asymmetrically. Several passes are necessary to obtain the final raw shape. During the last extrusion operation, it is possible to use a special shape, enabling to relatively precisely orient the pin. FIGS. 16 and 17 give examples of orientation shapes.

This shape is used to orient the pins in the coating enclosure. It is also used on assembly to provide the proper positioning of the pin in the connecting rod.

Further, given the asymmetrical stress in the pin, the shape may be adjusted to obtain an optimized cross-section in order to optimize the load pick-up in the pin cross-section.

BRIEF DESCRIPTION OF THE DRAWING FIGURES

The invention is discussed hereafter in further detail by means of the accompanying drawings, among which:

FIG. 5 shows the application of the invention to a piston pin.

FIG. 6 is a simplified transverse cross-section view showing the piston pin tightly assembled in the connecting rod, the pin being partially coated with the DLC-type anti-seize coating according to the features of the invention.

FIG. 7 is a perspective view of an example of assembly of the pins on a support assembled in a PVD enclosure to submit the pins to an anti-seize treatment with the application of a DLC layer over a limited angular sector.

FIG. 8 is a partial transverse cross-section view at larger scale corresponding to FIG. 7.

FIGS. 9 and 10 are, like FIGS. 7 and 8, views showing another embodiment for the application of the DLC coating according to a limited angular sector.

Figure 13:
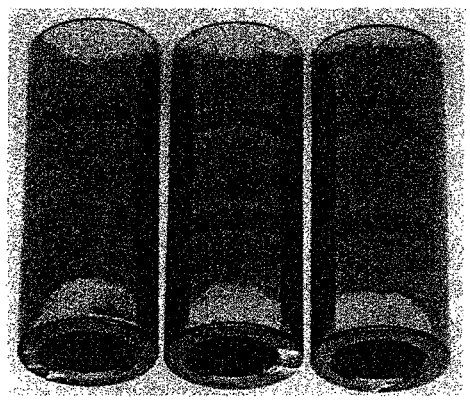
Figure 13:
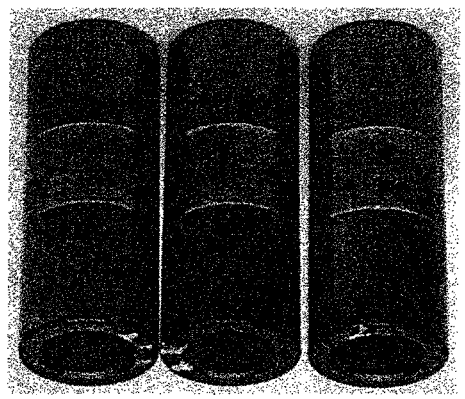
Figure 13:
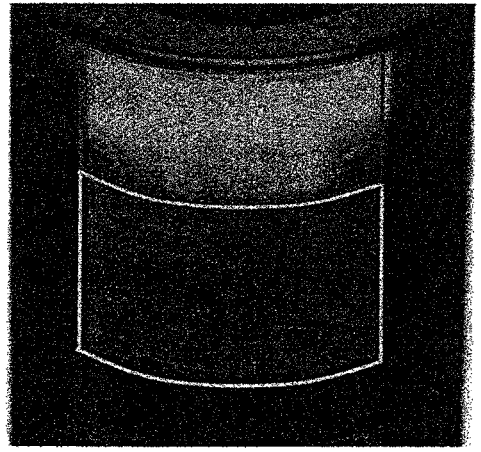
Figure 13:

FIG. 13 shows a load area of a tight pin. The pin load area is concentrated on the upper side of the pin. Hard polishing and high wear of coating layer in the upper contact surface. DLC coating layer locally 100% worn out. Only soft polishing of the coating layer in the lower contact surface. DLC layer thickness >90% of original coating layer.

Figure 14:
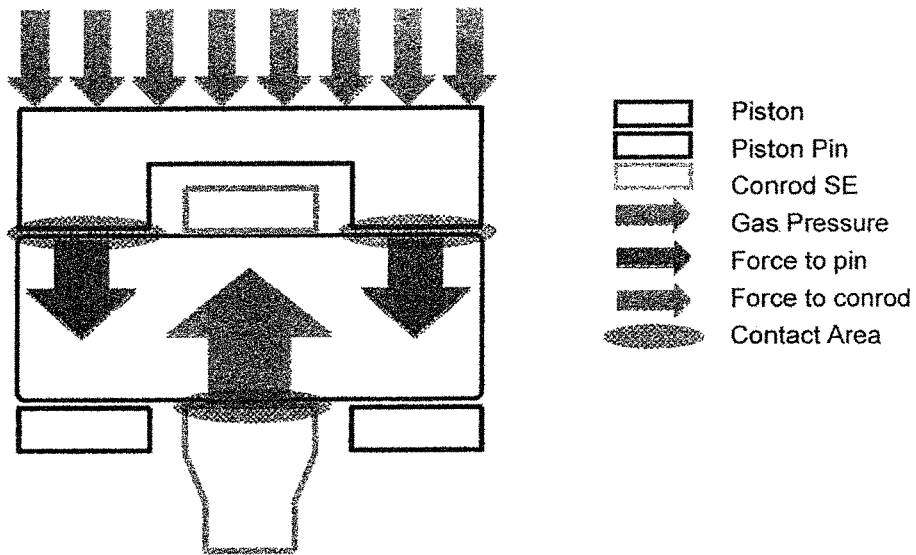

FIG. 14 shows forces acting at Full Load (Peak Cylinder Pressure).

Figure 15:
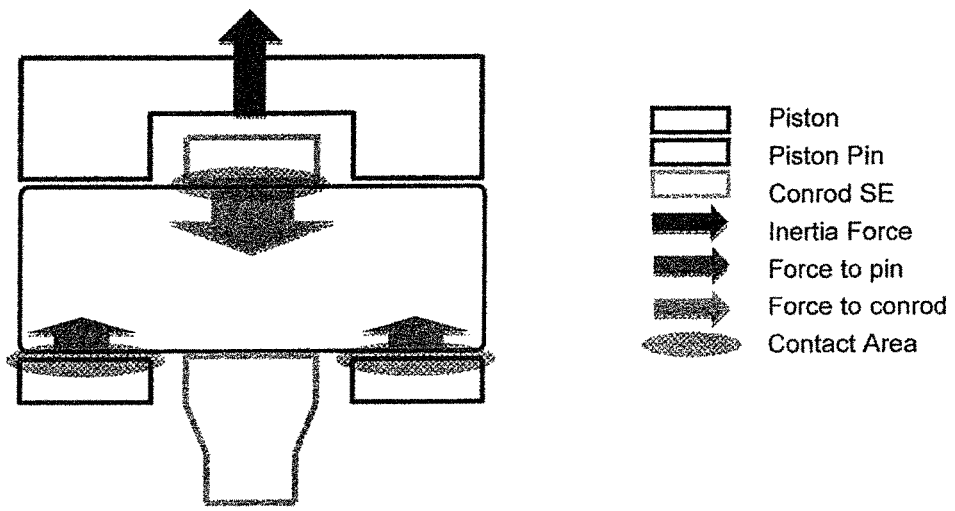

FIG. 15 shows forces acting at max engine speed (inertia forces).

Figure 16:
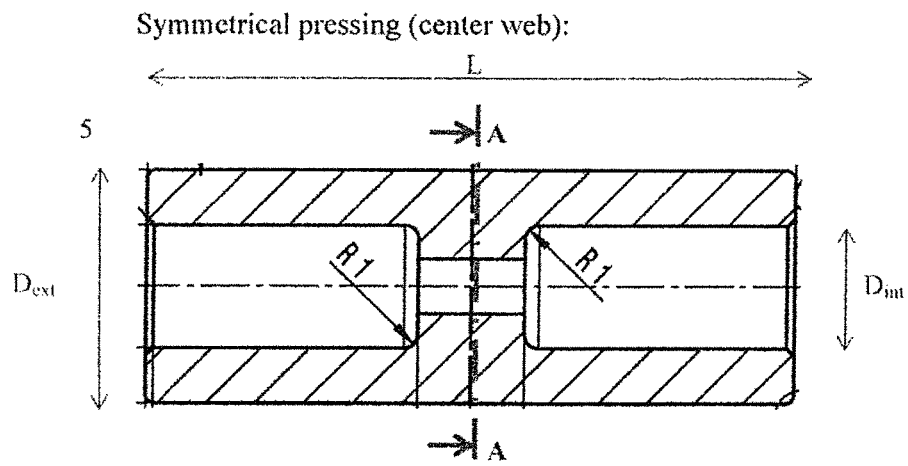

FIG. 16 is a longitudinal cross-section view of an embodiment of an example of pin orientation.

Figure 17:
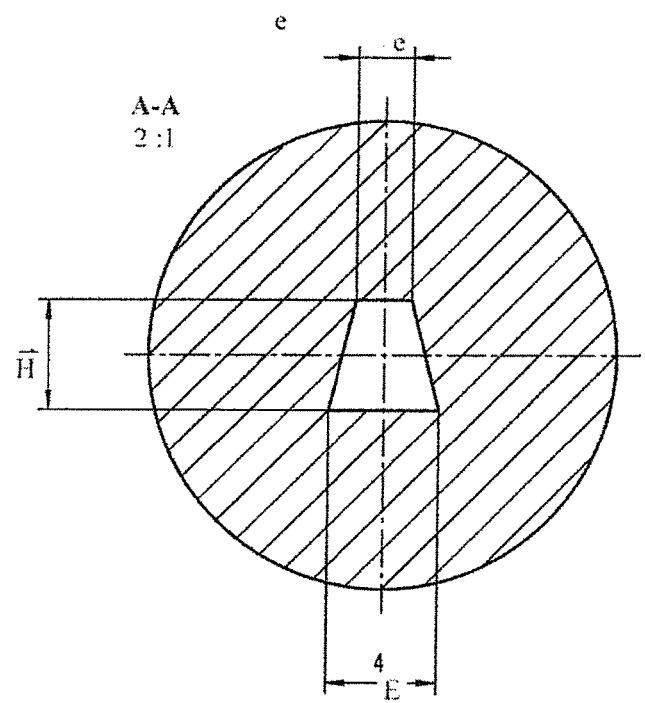

FIG. 17 is, at a larger scale, a cross-section view along line A-A of FIG. 16.

Figure 18:
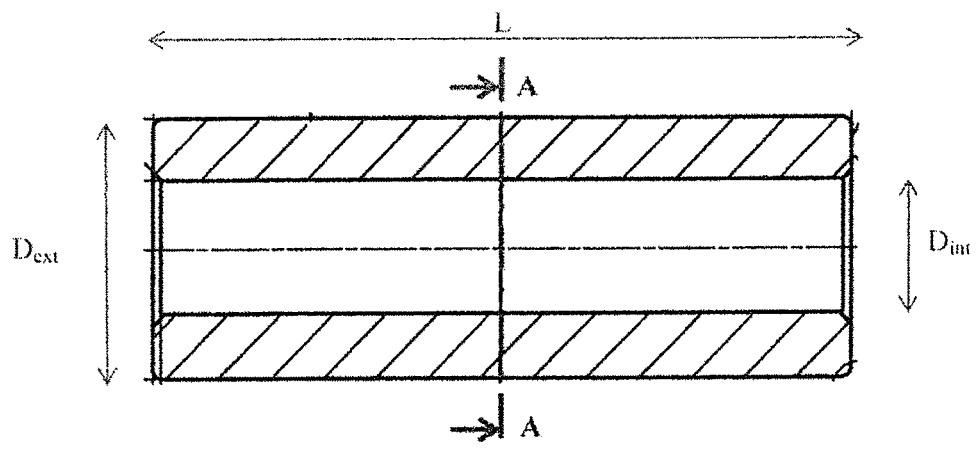

FIG. 18 is a longitudinal cross-section view of another embodiment of the pin.

Figure 19:
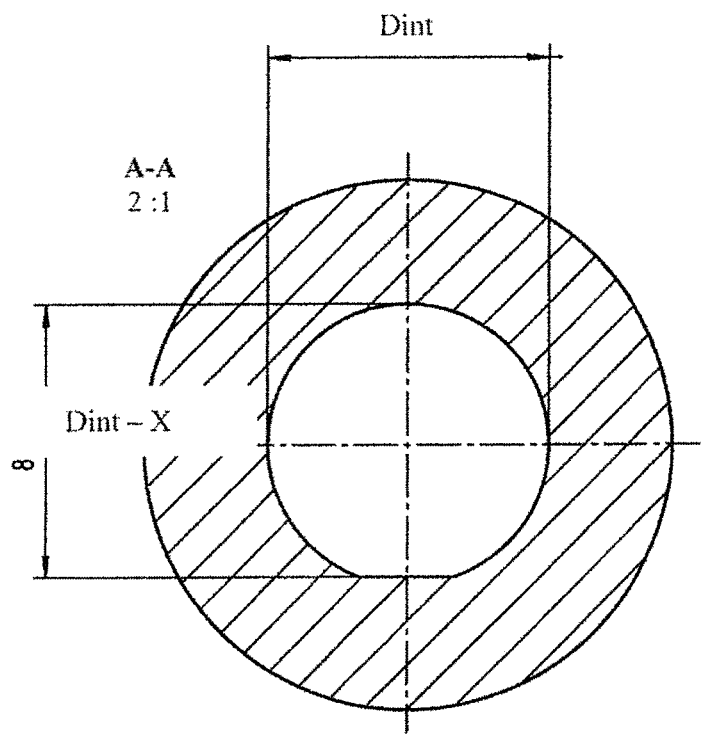

FIG. 19 is, at a larger scale, a cross-section view along line A-A of FIG. 18.

DETAILED DESCRIPTION

Figure 1:
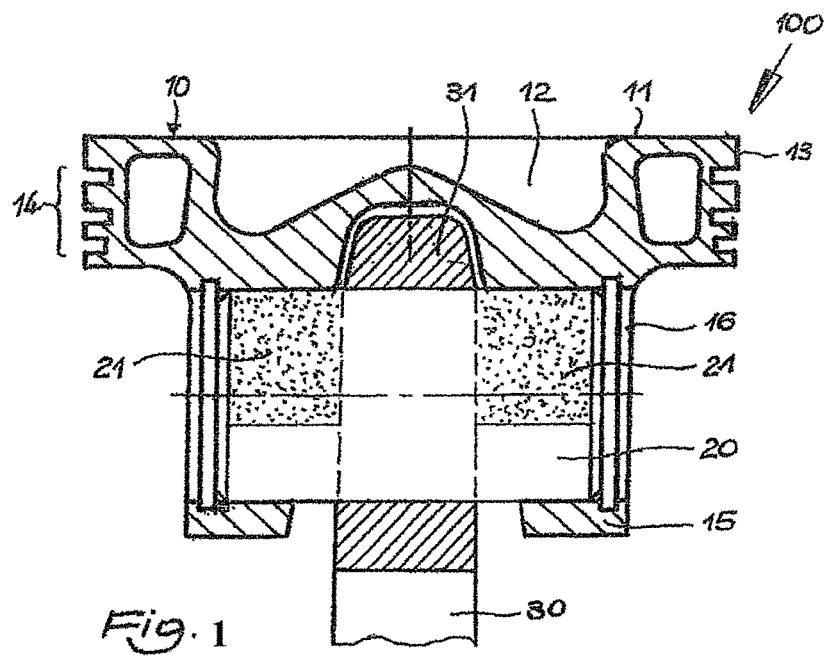
FIG. 1 is a cross-section view of a first embodiment of the structural unit according to the invention.
Figure 3:
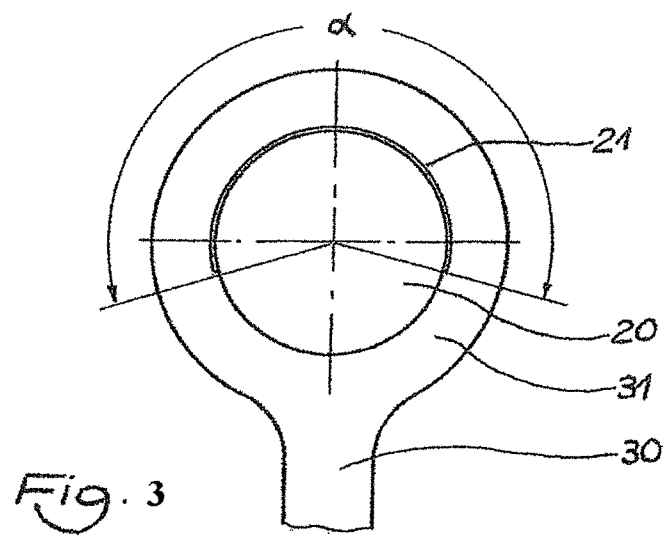
FIG. 3 is a front view of the small end of the connecting rod with the piston pins assembled according to FIG. 1.
Figure 4:
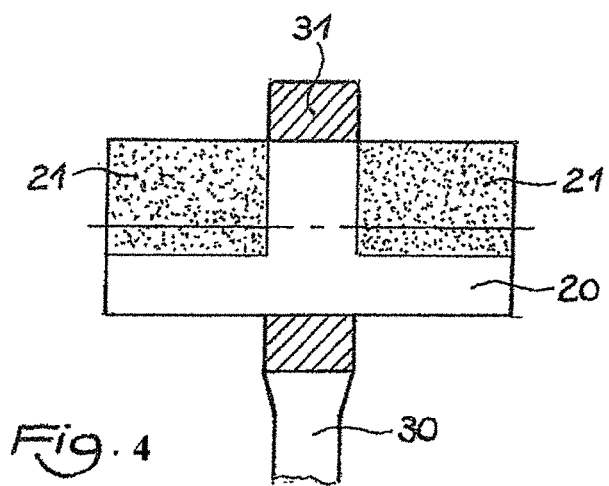
FIG. 4 is a lateral view of the small end of the connecting rod with the piston pins assembled according to FIG. 1.
Figure 11:
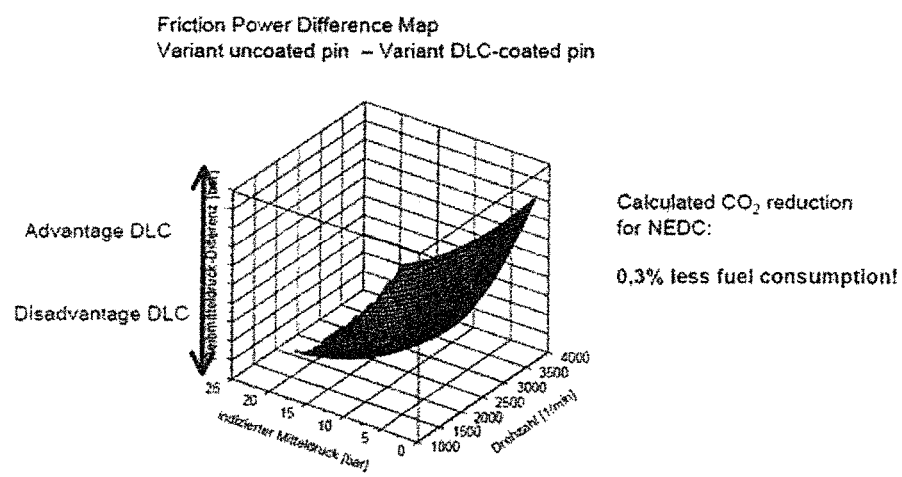
FIG. 11 shows the friction reduction by application of a DLC coating on the pin.
Figure 12:
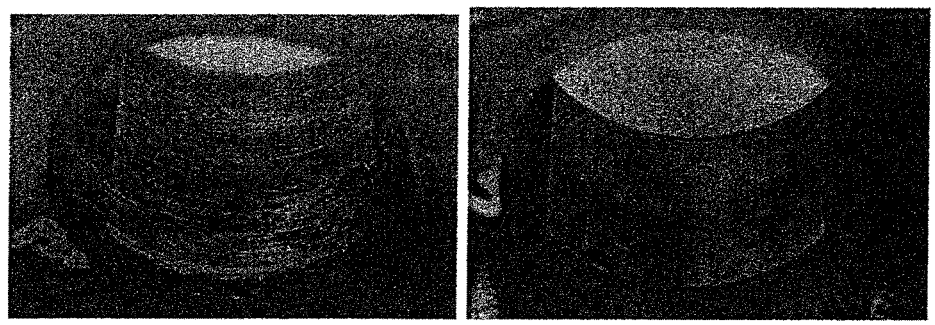
FIG. 12 shows the seizing risk prevention by application of a DLC coating on the pin.

FIGS. 1, 3, and 4 show an embodiment of a structural unit (100) according to the invention. The structural unit (100) is provided with a piston (10) which may be freely formed as concerns its composition and materials. The piston (10) of the embodiment is a one-piece box-shaped piston with a piston top (11), a combustion cavity (12), a peripheral piston cover (13), and a peripheral piston ring (14). The piston (10) is further provided with conventional piston bosses (15) with boss bores (16) for receiving a piston pin (20). The piston bosses (15) are conventionally connected by bearing surfaces (not shown).

The structural unit (100) is provided with a connecting rod (30) next to the piston (10) and to the piston pin (20). The connecting rod (30) is provided with a conventional small end (31). The piston pin (20) is fixedly and immovably assembled in the small end (31) of the connecting rod, for example, by binding. This type of connecting rod is also known as a "tight connecting rod".

Outside of the area covered with the connecting rod (30), the piston pin (20) is provided with an antifriction coating (21) made of a material to be selected according to the constraints of the specific case, as indicated. The materials may be selected from among DLC, PVD, PECVD coatings, coatings containing chromium and/or chromium nitride and/or tungsten such as chromium nitride, chromium carbide, and tungsten nitride or tungsten carbide, which are all commonly known.

According to the invention and as previously developed, the antifriction coating (21) is only applied in the areas of the piston pin (20) which are submitted to the highest load during the engine operation. Given that, during the engine operation, the piston pin (20) has a pendular motion commonly known in boss bores (16), only a well-defined peripheral area of the piston pin (20) is exposed to a high stress. According to the invention, this peripheral area is provided with an antifriction coating. In the embodiment, the antifriction coating (21) extends on a peripheral area of the piston pin (20) directed towards the top (11) of the piston (10) in a 220-degree angular field (α). It is generally recommended to apply the antifriction coating in an angular field (α) from 180 to 240 degrees on the piston pin (20) to obtain a satisfactory tribological behavior.

Figure 2:
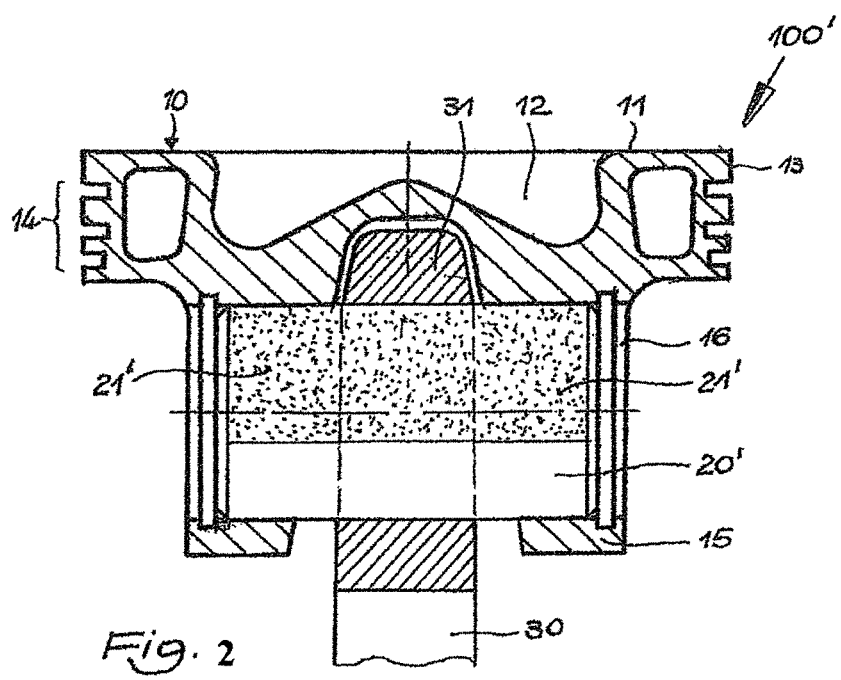
FIG. 2 is a cross-section view of another embodiment of the structural unit according to the invention.

FIG. 2 shows another embodiment of the structural unit (100') according to the invention where the structural elements identical to the structural unit (100) according to FIG. 1a are designated with the same symbols. The only difference between the structural unit (100) according to FIG. 1 and the structural unit (100') according to FIG. 2 is the coating (21') which, for the structural unit (100') according to FIG. 2, extends along the entire axial length of the piston pin (20'). This provides advantages in terms of manufacturing technique. The antifriction coating also extends on a peripheral area of the piston pin directed towards the top of the piston in an angular field from 180 to 240 degrees, particularly a 220-degree angular field.

As indicated, the invention more specifically applies to a piston pin.

FIG. 5 illustrates a pin (1) of a piston (2) tightly assembled in a connecting rod (3). At the time of the explosion, the pin (1) is stressed along a preferred direction (F) inducing a load on said pin over a partial angular sector.

According to the basic features of the invention, a DLC-type anti-seize coating (4) is applied to the pin (1) over a limited angular sector (S) corresponding to at least the friction area submitted to the contact pressure along the preferential direction (F). Without for all this departing from the framework of the invention, other anti-seize PVD, PECVD coatings than DLC may be used, such as coatings containing chromium and/or chromium nitride and/or tungsten such as chromium nitride, chromium carbide, and tungsten nitride or tungsten carbide, or TiAlN, all commonly known.

Reference should be made to FIGS. 7 and 8 and to FIGS. 9 and 10 which show two solutions for applying a DLC-type coating on a portion only of the circumference of the pins (1). The pins (1) are positioned circularly at the periphery of a support (5) along at least one row. The pins (1) are locked in rotation and arranged in tangency position.

In the embodiment illustrated in FIGS. 7 and 8, the pins (1) are arranged around a center web (6) which prevents the rotation of said pins for their rotation locking, as indicated. Still in this embodiment, to treat a significant number of pins, the latter are stacked on one another by using the internal bore of said pins which cooperates with guide rods (7).

After cleaning of the pins (1), the latter are arranged as indicated according to the previously-defined assembly which is then, as perfectly well known, loaded into a vacuum deposition enclosure (not shown). During the pumping operation, the vacuum deposition enclosure and the pins (1) are degassed by radiative heating at a reference temperature respecting the pin tempering temperature. When the vacuum reaches a $2 \cdot 10^{-5}$-mbar value, argon is introduced into the enclosure to reach a pressure in the order of $10^{-3}$ mbar. The etch parameters are adapted to enable to remove an oxide layer naturally present on pins (1), including, in confined areas, at the junction of the pins (1) resulting from their tangential positioning. The parameters are adapted to decrease the voltage on the pins while increasing the current, to decrease the cathode glow.

After etching, a chromium nitride deposition is performed according to a magnetron sputtering method. At the end of the PVD, an amorphous carbon-type deposit is deposited by PECVD. This a-C:H amorphous carbon layer is preceded by a transition layer for example containing a-C:H—Si-type silicon. This application of the DLC coating is perfectly well known by those skilled in the art and is provided as a non-limiting indication only.

The invention does not lie in the actual application of DLC, but rather in the method enabling to coat a portion only of the pin circumference with this DLC coating.

In this configuration, tests have demonstrated that a coating over a total angular section of 200° (−100° to +100°)

is obtained. This coating is adhesive on a sector ranging from −85° to +80°, that is, a total 155° angular sector. The thickness of the DLC coating is uniform to within ±20% over a sector ranging from −70° to +65°, that is, a 135° angular sector. (Note: The coating is considered as functional on this angular sector). On the opposite sector from +100° to −100°, a total lack of DLC coating can be observed.

In the embodiment illustrated in FIGS. 9 and 10, the stopping of the coated area is not induced by the contact with the adjacent pin, but by an added protection element (8) capable of delimiting, for each of the pins, an angular sector.

In this embodiment, the pins (1) as previously indicated in the case of the embodiment illustrated in FIGS. 7 and 8, are locked in rotation and are positioned tangently or, in this case, almost tangently, given the installation of the protection element (8) between two adjacent pins (1). Tests have been carried out with steel pins (1) having 20-mm and 28-mm diameters. Such pins have followed the same procedure as that previously indicated for the actual application of the DLC coating (cleaning, placing under vacuum, degassing, etching, deposition).

In this configuration, an adhesive coating is obtained over the entire coated angular sector (S), that is, approximately from −50° to +50°, for the pin having a 20-mm diameter and from −62.5° to +62.5° for the pin having a 28-mm diameter. The thickness of the DLC coating is uniform to within ±20% over this same angular sector (S). For the 20-mm pin and the opposite sector ranging from +50° to −50°, a total lack of coating can be observed. The same is true for the pin of 28-mm diameter on the opposite sector from +62.5° to −62.5°

In this configuration, the use of an added protection element (8) to define and limit the area to be coated with DLC enables to have an adhesive coating, of uniform thickness, over the entire angular sector concerned by the DLC coating and delimited by said protection element (8). A judicious positioning of this protection element (8) provides an adhesive coating having a satisfactory morphology over an angular sector capable of reaching 240° (from −120° to +120°).

As indicated, for the application of DLC over a determined sector only, properly orienting the pin is essential. Reference should be made to the indicative examples of FIGS. 16 to 19.

Comparative tests have been carried out in the case of the application of the DLC coating over the entire periphery of the pin according to prior art and along a portion only of said periphery according to the features of the invention.

The tests have been carried out on a pin having a 16-mm diameter and a 45-mm length. In the case of a DLC coating over 360° (prior state of the art), a so-called triple-rotation configuration needs to be used. In this case, it is possible to treat 4,356 pins by loading into a TSD850 machine sold by HEF-Durferrit. When the pins are treated, according to the features of the invention, that is, application of DLC coatings over a limited angular sector and in the configuration illustrated in FIGS. 7 and 8, a so-called double-rotation configuration is sufficient. In this case, it is possible to treat 5,544 pins by loading into the same type of TSD 850 machine. A machine filling gain in the order of 25% is accordingly obtained.

According to the invention, due to the passing from the triple-rotation configuration to the double-rotation configuration, a gain is also obtained on DLC coating cycle times.

In the context of a DLC coating having a 3-µm thickness according to prior art (coating over 360°), the triple-rotation configuration cycle time is 15.5 hours in a TSD 850 machine, while according to the invention (coating over a limited angular sector), the cycle time in double-rotation configuration, still in a TSD 850 machine, is 11.2 hours, that is, with a time gain in the order of 35%.

In addition to these advantages, the fact of applying the DLC coating on a partial angular sector of the pin enables to increase the coating thickness while remaining economically advantageous. Such a thickness increase enables to increase the pin lifetime, and is particularly advantageous in the case of high-load applications. The thickness of the DLC coating may thus be in the range from 1 to 10 µm.

Without for all this departing from the framework of the invention, it is not excluded for the pin (or other) to also be coated outside of the friction area. In this case, the characteristics of this coating (thickness and/or hardness and/or friction coefficient) are lower than the characteristics of the anti-seize coating of the angular sector corresponding to the friction area.

The invention claimed is:

1. A piston pin having an anti-seize coating limited to a single angular sector corresponding at least to a friction area submitted to a contact pressure along a preferential direction, wherein the single angular sector is in a range from 15° to 240°.

2. The pin of claim 1, wherein the anti-seize coating comprises DLC.

3. The pin of claim 1, wherein the anti-seize coating comprises CrN.

4. The pin of claim 1, wherein the anti-seize coating comprises TiAlN.

5. The pin of claim 1, wherein outside of said friction area, the pin has a coated area having a thickness characteristic and/or a hardness characteristic and/or a friction coefficient characteristic lower than corresponding characteristic(s) of the anti-seize coating of the angular sector.

6. The pin of claim 1, wherein the single angular sector is in a range from 15° to 220°.

7. The pin of claim 1, wherein thickness of the coating on the friction area is homogeneous to within ±20%.

8. The pin of claim 7, wherein the coating thickness ranges between 1 and 10 µm.

9. A structural unit for a combustion engine, comprising: a piston provided with a piston top, the piston pin according to claim 1, and a connecting rod, wherein the connecting rod is provided with a small end and wherein the piston is provided with boss bores having the piston pin assembled therein, wherein the piston pin is rigidly secured in the small end of the connecting rod and the anti-seize coating extends on a peripheral area of the piston pin which is submitted to highest load during engine operation, at least in the area of the boss bores of the piston.

10. The structural unit of claim 9, wherein the anti-seize coating extends over the peripheral area of the piston pin directed towards the top of the piston, and the single angular sector is in a range from 180 to 240 degrees.

11. The structural unit of claim 10, wherein the single angular sector comprises 220 degrees.

12. The structural unit of claim 9, wherein the anti-seize coating extends all along an axial length of the piston pin.

* * * * *